United States Patent
Lee et al.

(10) Patent No.: US 7,774,035 B2
(45) Date of Patent: Aug. 10, 2010

(54) SUPERCONDUCTING ARTICLES HAVING DUAL SIDED STRUCTURES

(75) Inventors: Hee-Gyoun Lee, Ansan (KR); Yi-Yuan Xie, Guilderland, NY (US)

(73) Assignee: SuperPower, Inc., Schenectady, NY (US)

(*) Notice: Subject to any disclaimer, the term of this patent is extended or adjusted under 35 U.S.C. 154(b) by 739 days.

(21) Appl. No.: 11/522,850

(22) Filed: Sep. 18, 2006

(65) Prior Publication Data

US 2010/0173784 A1   Jul. 8, 2010

Related U.S. Application Data

(60) Continuation-in-part of application No. 11/130,349, filed on May 16, 2005, now Pat. No. 7,109,151, which is a division of application No. 10/607,945, filed on Jun. 27, 2003, now abandoned.

(51) Int. Cl.
*H01L 39/14* (2006.01)

(52) U.S. Cl. .................. 505/231; 505/230; 505/237; 505/238; 428/930

(58) Field of Classification Search ............ 505/230, 505/231, 237, 238
See application file for complete search history.

(56) References Cited

U.S. PATENT DOCUMENTS

| | | | |
|---|---|---|---|
| 3,954,572 A | | 5/1976 | Ziegler et al. |
| 4,333,228 A | * | 6/1982 | Koch .................. 29/599 |
| 4,560,445 A | | 12/1985 | Hoover et al. |
| 4,652,346 A | | 3/1987 | Polan |
| 5,480,861 A | | 1/1996 | Tanaka et al. |
| 5,801,124 A | | 9/1998 | Gamble et al. |
| 5,987,342 A | | 11/1999 | Scudiere et al. |
| 6,187,166 B1 | | 2/2001 | Moehle et al. |
| 6,230,033 B1 | | 5/2001 | Scudiere et al. |
| 6,271,474 B1 | | 8/2001 | Fujikami et al. |

(Continued)

FOREIGN PATENT DOCUMENTS

EP    0398374 A    11/1990

(Continued)

OTHER PUBLICATIONS

Fu, Y., et al., "Copper Stabilization of YBCO Coated Conductor for Quench Protection", Symposium, Aug. 9, 2002, Applied Superconductivity Conference & Expo (And accompanying article, 4 pages).

(Continued)

*Primary Examiner*—Stanley Silverman
*Assistant Examiner*—Paul Wartalowicz
(74) *Attorney, Agent, or Firm*—Larson Newman & Abel LLP

(57) ABSTRACT

A superconducting article includes a substrate; first and second buffer layers overlying the substrate, such that the substrate is positioned so as to be interposed between the first and second buffer layers, first and second superconductor layers overlying the first and second buffer layers. Further, the first and second stabilizer layers respectively overlying the first and second superconductor layers, the first and second stabilizer layers adapted to conduct current and prevent burnout of the first and second superconductor layers when the first and second superconductor layers are in a non-superconductive state.

17 Claims, 7 Drawing Sheets

U.S. PATENT DOCUMENTS

| | | |
|---|---|---|
| 6,309,767 B1 | 10/2001 | Nies |
| 2002/0144838 A1 | 10/2002 | Fritzemeier et al. |
| 2004/0248743 A1 | 12/2004 | Norton et al. |
| 2005/0173679 A1 | 8/2005 | Mannhart et al. |
| 2006/0073979 A1* | 4/2006 | Thieme et al. ............... 505/434 |

FOREIGN PATENT DOCUMENTS

| | | |
|---|---|---|
| JP | 07335051 A | 12/1995 |
| WO | 00/58530 A | 10/2000 |
| WO | 01/08169 A | 2/2001 |
| WO | 01/52393 A | 7/2001 |
| WO | WO/03/071611 * | 8/2003 |

OTHER PUBLICATIONS

Cantoni, C., et al., "Conductive Buffer Layers and Overlayers for the Thermal Stabilitity of Coated Conductors", Article, Mar. 2001, 4 pages, vol. 11, No. 1, Institute of Electrical & Electronics Engineers, New York, U.S.A.

Larbalestier, David, et al., "High—Tc Superconducting Materials for Electric Power Applications", NATURE, vol. 414, Nov. 15, 2001, pp. 368-377.

* cited by examiner

SUPERCONDUCTING ARTICLES HAVING DUAL SIDED STRUCTURES

CROSS-REFERENCE TO RELATED APPLICATION(S)

The present application is a continuation-in-part of U.S. application Ser. No. 11/130,349, filed May 16, 2005, which is a divisional application of U.S. application Ser. No. 10/607,945, filed Jun. 27, 2003, to which priority is claimed hereunder and which applications are both incorporated herein by reference in their entirety.

BACKGROUND

1. Field of the Invention

The present invention is generally directed to superconducting or superconductor components, and in particular, a novel superconducting tape, power components incorporating same, and methods for utilizing and manufacturing same.

2. Description of the Related Art

Superconductor materials have long been known and understood by the technical community. Low-temperature (low-$T_c$) superconductors exhibiting superconductive properties at temperatures requiring use of liquid helium (4.2K), have been known since about 1911. However, it was not until somewhat recently that oxide-based high-temperature (high-$T_c$) superconductors have been discovered. Around 1986, a first high-temperature superconductor (HTS), having superconductive properties at a temperature above that of liquid nitrogen (77K) was discovered, namely $YBa_2Cu_3O_{7-x}$ (YBCO), followed by development of additional materials over the past 15 years including $Bi_2Sr_2Ca_2Cu_3O_{10+y}$ (BSCCO), and others. The development of high-$T_c$ superconductors has brought potential, economically feasible development of superconductor components incorporating such materials, due partly to the cost of operating such superconductors with liquid nitrogen, rather than the comparatively more expensive cryogenic infrastructure based on liquid helium.

Of the myriad of potential applications, the industry has sought to develop use of such materials in the power industry, including applications for power generation, transmission, distribution, and storage. In this regard, it is estimated that the native resistance of copper-based commercial power components is responsible for quite significant losses in electricity, and accordingly, the power industry stands to gain significant efficiencies based upon utilization of high-temperature superconductors in power components such as transmission and distribution power cables, generators, transformers, and fault current interrupters. In addition, other benefits of high-temperature superconductors in the power industry include an increase in one to two orders of magnitude of power-handling capacity, significant reduction in the size (i.e., footprint) of electric power equipment, reduced environmental impact, greater safety, and increased capacity over conventional technology. While such potential benefits of high-temperature superconductors remain quite compelling, numerous technical challenges continue to exist in the production and commercialization of high-temperature superconductors on a large scale.

Among the many challenges associated with the commercialization of high-temperature superconductors, many exist around the fabrication of a superconducting tape that can be utilized for formation of various power components. A first generation of HTS tapes includes use of the above-mentioned BSCCO high-temperature superconductor. This material is generally provided in the form of discrete filaments, which are embedded in a matrix of noble metal, typically silver. Although such conductors may be made in extended lengths needed for implementation into the power industry (such as on the order of kilometers), due to materials and manufacturing costs, such tapes do not represent a commercially feasible product.

Accordingly, a great deal of interest has been generated in the so-called second-generation HTS tapes that have superior commercial viability. These tapes typically rely on a layered structure, generally including a flexible substrate that provides mechanical support, at least one buffer layer overlying the substrate, the buffer layer optionally containing multiple films, an HTS layer overlying the buffer film, and an electrical stabilizer layer overlying the superconductor layer, typically formed of at least a noble metal. However, to date, numerous engineering and manufacturing challenges remain prior to full commercialization of such second generation-tapes.

Accordingly, in view of the foregoing, various needs continue to exist in the art of superconductors, and in particular, provision of commercially viable superconducting tapes, methods for forming same, and power components utilizing such superconducting tapes.

SUMMARY

According to a first aspect of the present invention, a superconducting article is provided, which includes a substrate, first and second buffer layers overlying the substrate, such that the substrate is positioned so as to be interposed between the first and second buffer layers; first and second superconductor layers overlying the first and second buffer layers, respectively, and first and second stabilizer layers respectively overlying the first and second superconductor layers. The first and second stabilizer layers are adapted to conduct current and prevent burnout of the first and second superconductor layers when the first and second superconductor layers are in a non-superconductive state.

Another embodiment calls for a superconducting article, including a substrate; first and second buffer layers overlying the substrate, such that the substrate is positioned so as to be interposed between the first and second buffer layers, a plurality of superconductor layers including first and second outermost superconductor layers overlying the first and second buffer layers, respectively, and first and second stabilizer layers respectively overlying the first and second outermost superconductor layers. The superconducting article is free of any substrates between the first and second outermost superconductor layers and respective first and second stabilizer layers.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
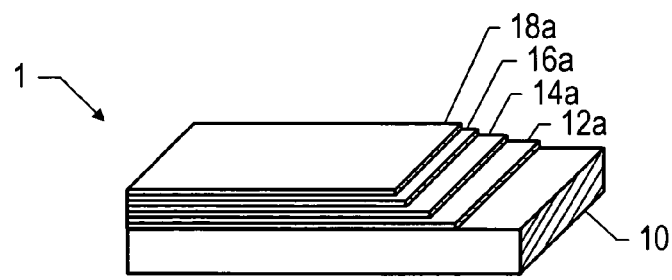
FIG. 1 illustrates an HTS conductive tape according to an embodiment of the present invention.

Turning to FIG. 1, the general layered structure of an HTS conductor according to an embodiment of the present invention is depicted. The HTS conductor includes a substrate 10, a buffer layer 12a overlying the substrate 10, an HTS layer 14a, followed by a capping layer 16a, typically a noble metal layer, and a stabilizer layer 18a, typically a non-noble metal.

The substrate 10 is generally metal-based, and typically, an alloy of at least two metallic elements. Particularly suitable substrate materials include nickel-based metal alloys such as the known Inconel® group of alloys. The Inconel® alloys tend to have desirable thermal, chemical and mechanical properties, including coefficient of expansion, thermal conductivity, Curie temperature, tensile strength, yield strength, and elongation. These metals are generally commercially available in the form of spooled tapes, particularly suitable for HTS tape fabrication, which typically will utilize reel-to-reel tape handling.

The substrate 10 is typically in a tape-like configuration, having a high aspect ratio. For example, the width of the tape is generally on the order of about 0.4-10 cm, and the length of the tape is typically at least about 100 m, most typically greater than about 500 m. Indeed, embodiments of the present invention provide for superconducting tapes that include substrate 10 having a length on the order of 1 km or above. Accordingly, the substrate may have an aspect ratio which is fairly high, on the order of not less than $10^3$, or even not less than $10^4$. Certain embodiments are longer, having an aspect ratio of $10^5$ and higher. As used herein, the term 'aspect ratio' is used to denote the ratio of the length of the substrate or tape to the next longest dimension, the width of the substrate or tape.

In one embodiment, the substrate is treated so as to have desirable surface properties for subsequent deposition of the constituent layers of the HTS tape. For example, the surface may be lightly polished to a desired flatness and surface roughness. Additionally, the substrate may be treated to be biaxially textured as is understood in the art, such as by the known RABiTS (roll assisted biaxially textured substrate) technique.

Turning to the buffer layer 12a, the buffer layer may be a single layer, or more commonly, be made up of several films. Most typically, the buffer layer includes a biaxially textured film, having a crystalline texture that is generally aligned along crystal axes both in-plane and out-of-plane of the film. Such biaxial texturing may be accomplished by IBAD. As is understood in the art, IBAD is acronym that stands for ion beam assisted deposition, a technique that may be advantageously utilized to form a suitably textured buffer layer for subsequent formation of an HTS layer having desirable crystallographic orientation for superior superconducting properties. Magnesium oxide is a typical material of choice for the IBAD film, and may be on the order or 50 to 500 Angstroms, such as 50 to 200 Angstroms. Generally, the IBAD film has a rock-salt like crystal structure, as defined and described in U.S. Pat. No. 6,190,752, incorporated herein by reference.

The buffer layer may include additional films, such as a barrier film provided to directly contact and be placed in between an IBAD film and the substrate. In this regard, the barrier film may advantageously be formed of an oxide, such as yttria, and functions to isolate the substrate from the IBAD film. A barrier film may also be formed of non-oxides such as silicon nitride and silicon carbide. Suitable techniques for deposition of a barrier film include chemical vapor deposition and physical vapor deposition including sputtering. Typical thicknesses of the barrier film may be within a range of about 100-200 angstroms. Still further, the buffer layer may also include an epitaxially grown film, formed over the IBAD film. In this context, the epitaxially grown film is effective to increase the thickness of the IBAD film, and may desirably be made principally of the same material utilized for the IBAD layer such as MgO.

In embodiments utilizing an MgO-based IBAD film and/or epitaxial film, a lattice mismatch between the MgO material and the material of the superconductor layer exists. Accordingly, the buffer layer may further include another buffer film, this one in particular implemented to reduce a mismatch in lattice constants between the HTS layer and the underlying IBAD film and/or epitaxial film. This buffer film may be formed of materials such as YSZ (yttria-stabilized zirconia) strontium ruthenate, lanthanum manganate, and generally, perovskite-structured ceramic materials. The buffer film may be deposited by various physical vapor deposition techniques.

While the foregoing has principally focused on implementation of a biaxially textured film in the buffer stack (layer) by a texturing process such as IBAD, alternatively, the substrate surface itself may be biaxially textured. In this case, the buffer layer is generally epitaxially grown on the textured substrate so as to preserve biaxial texturing in the buffer layer. One process for forming a biaxially textured substrate is the process known in the art as RABiTS (roll assisted biaxially textured substrates), generally understood in the art.

The high-temperature superconductor (HTS) layer 14a is typically chosen from any of the high-temperature superconducting materials that exhibit superconducting properties above the temperature of liquid nitrogen, 77K. Such materials may include, for example, $YBa_2Cu_3O_{7-x}$, $Bi_2Sr_2Ca_2Cu_3O_{10+y}$, $Tl_2Ba_2Ca_2Cu_3O_{10+y}$, and $HgBa_2Ca_2Cu_3O_{8+y}$. One class of materials includes $REBa_2Cu_3O_{7-x}$, wherein RE is a rare earth element. Of the foregoing, $YBa_2Cu_3O_{7-x}$, also generally referred to as YBCO, may be advantageously utilized. The HTS layer 14a may be formed by any one of various techniques, including thick and thin film forming techniques. Preferably, a thin film physical vapor deposition technique such as pulsed laser deposition (PLD) can be used for a high deposition rates, or a chemical vapor deposition technique can be used for lower cost and larger surface area treatment. Typically, the HTS layer has a thickness on the order of about 1 to about 30 microns, most typically about 2 to about 20 microns, such as about 2 to about 10 microns, in order to get desirable amperage ratings associated with the HTS layer 14a.

The capping layer 16a and the stabilizer layer 18a are generally implemented for electrical stabilization, to aid in prevention of HTS burnout in practical use. More particularly, layers 16a and 18a aid in continued flow of electrical charges along the HTS conductor in cases where cooling fails or the critical current density is exceeded, and the HTS layer moves from the superconducting state and becomes resistive. Typically, a noble metal is utilized for capping layer 16a to prevent unwanted interaction between the stabilizer layer(s) and the HTS layer 14a. Typical noble metals include gold, silver, platinum, and palladium. Silver is typically used due to its cost and general accessibility. The capping layer 16a is typically made to be thick enough to prevent unwanted diffusion of the components from the stabilizer layer 18a into the HTS layer 14a, but is made to be generally thin for cost reasons (raw material and processing costs). Typical thicknesses of the capping layer 16a range within about 0.1 to about 10.0 microns, such as 0.5 to about 5.0 microns. Various techniques may be used for deposition of the capping layer 16a, including physical vapor deposition, such as DC magnetron sputtering.

According to a particular feature of an embodiment of the present invention, a stabilizer layer 18a is incorporated, to overlie the superconductor layer 14a, and in particular, overlie and directly contact the capping layer 16a in the particular embodiment shown in FIG. 1. The stabilizer layer 18a functions as a protection/shunt layer to enhance stability against harsh environmental conditions and superconductivity quench. The layer is generally dense and thermally and electrically conductive, and functions to bypass electrical current in case of failure in the superconducting layer. Conventionally, such layers have been formed by laminating a preformed copper strip onto the superconducting tape, by using an intermediary bonding material such as a solder or flux. Other techniques have focused on physical vapor deposition, typically, sputtering. However, such application techniques are costly, and not particularly economically feasible for large-scale production operations. According to a particular feature of the embodiment, the stabilizer layer 18 is formed by electroplating. According to this technique, electroplating can be used to quickly build-up a thick layer of material on the superconducting tape, and it is a relatively low cost process that can effectively produce dense layers of thermally and electrically conductive metals. According to one feature, the stabilizer layer is deposited without the use of or reliance upon and without the use of an intermediate bonding layer, such as a solder layer (including fluxes) that have a melting point less than about 300° C.

Noteworthy, the stabilizer layers generally have a resistivity not greater than 30 nΩ·m to enable successful stabilization functionality, that is, to enable continued current flow without superconductor burnout when the superconductor is no longer in the superconducting state. In this respect, oftentimes bonding layers between layered superconductor subcomponents (i.e., superconductor structure building blocks, typically including a substrate, buffer layer and superconductor layer) generally are not configured to enable stabilization. One example of this is the structure shown in US 2005/0173679, which utilizes a YBCO matrix (highly resistive in the non-superconductive state, typically above 1000 nΩ·m) partly filled with silver, the silver used for bonding purposes. In the non-superconductive state, the silver is not sufficient, both in terms of content and distribution, to enable stabilization of the superconductor article. That is, the bonding layer of U.S. Pat. No. '679 is understood to have excessive resistivity to prevent burnout and is limited in functionality to bonding and not to stabilization.

Electroplating (also known as electrodeposition) is generally performed by immersing the superconductive tape in a solution containing ions of the metal to be deposited. The surface of the tape is connected to an external power supply and current is passed through the surface into the solution, causing a reaction of metal ions ($M^{z-}$) with electrons ($e^-$) to form a metal (M).

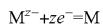

The capping layer 16a functions as a seed layer for deposition of copper thereon. In the particular case of electroplating of stabilizer metals, the superconductive tape is generally immersed in a solution containing cupric ions, such as in a copper sulfate solution. Electrical contact is made to the capping layer 16a and current is passed such that the reaction $Cu^{2+}+2e^-\rightarrow Cu$ occurs at the surface of the capping layer 16a. The capping layer 16a functions as the cathode in the solution, such that the metal ions are reduced to Cu metal atoms and deposited on the tape. On the other hand, a copper-containing anode is placed in the solution, at which an oxidation reaction occurs such that copper ions go into solution for reduction and deposition at the cathode.

In the absence of any secondary reactions, the current delivered to the conductive surface during electroplating is directly proportional to the quantity of metal deposited (Faraday's Law of Electrolysis). Using this relationship, the mass, and hence thickness of the deposited material forming stabilizer layer 18a can be readily controlled.

While the foregoing generally references copper, it is noted that other metals, including non-noble metals such as aluminum, silver, gold, and other thermally and electrically conductive metals may also be utilized. However, it is generally desirable to utilize a non-noble metal to reduce overall materials cost for forming the superconductive tape, and is such a case, the stabilizer layer is generally free of noble metals.

While the foregoing description and FIG. 1 describe electroplating to form a stabilizer layer 18a along one side of the superconductive tape, it is also noted that the opposite, major side of the superconductive tape may also be coated, and indeed, the entirety of the structure can be coated so as to be encapsulated. In this regard, attention is drawn to FIG. 2.

Figure 2:
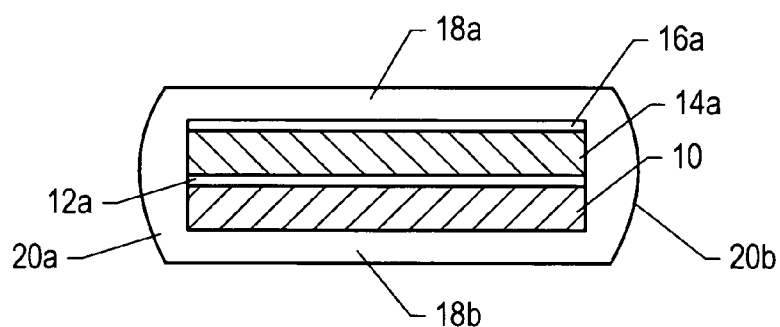
FIG. 2 illustrates a cross-section of a HTS tape according to another embodiment of the present invention in which the entire superconductive tape is encapsulated by electroplated stabilizer.

FIG. 2 is a cross-sectional diagram illustrating another embodiment of the present invention, in which the entire superconductive tape is encapsulated with first stabilizer layer 18a, second stabilizer layer 18b disposed on an opposite major surface of the superconductive tape, the first and second stabilizer layers 18a, 18b, joining together along the side surfaces of the superconductive tape, forming generally convex side portions or side bridges 20a and 20b. This particular structure is desirable to further improve current flow and further protect the HTS layer 14a, in the case of cryogenic failure, superconductivity quench, etc. By essentially doubling the cross-sectional area of the deposited stabilizer layer by forming first and second stabilizer layers 18a and 18b, a marked improvement in current-carrying capability is provided. Electrical continuity between stabilizer layers 18a and 18b may be provided by the lateral bridging portions 20a and 20b. In this regard, the lateral bridging portions 20a and 20b may desirably have a positive radius of curvature so as to form generally convex surfaces, which may further reduce build up of electrical charge at high voltages that HTS electric power devices will experience. Additionally, to the extent that a suitably electrically conductive material is utilized for the substrate 10, further current-carrying capability can be provided by encapsulation (fully surrounding the constituent layers of the article) as illustrated in FIG. 2. That is, the bridging portions extending laterally and defining side surfaces of the tape may provide electrical connection to the substrate itself, which can add to the current carrying capability of the coated conductor (tape).

While embodiments of the present invention are particularly suitable for formation of a stabilizer layer that is continuous, having side bridges that are formed of the same material, other embodiments utilize a different material for the side bridges. For example, the lateral surfaces can be masked during stabilizer deposition, followed by mask removal and deposition of a different side bridge composition. Particularly suitable are high melting point solders, such as lead-tin compositions. Typically, such solders have a melting point greater than about 180° C. Use of high melting point solders or use of a surround stabilizer (which also has a melting point greater than 180° C.) such as copper is of notable importance. Particularly, high melting point materials permit improved flexibility of conductor processing by the end user, due to greater temperature range in which the conductor can be manipulated, such as during joining operations.

While not shown in FIG. 2, it may be generally desirable to deposit a noble metal layer along the entirety of the superconductive tape, particularly along the side surfaces of the superconductive tape, to isolate the superconductor layer 14a from the material of the bridging portions 20a and 20b, which may be a non-noble metal such as copper or aluminum as described above.

Figure 3A:
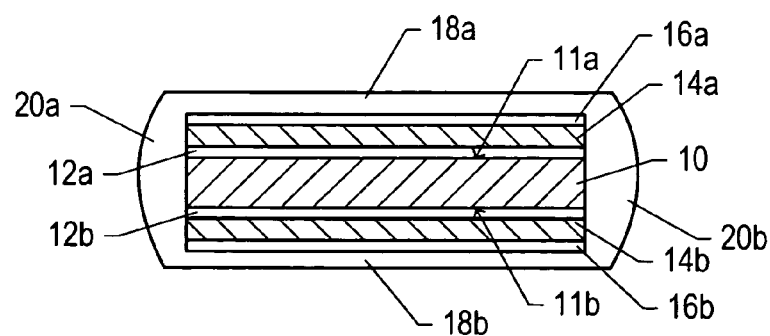
FIGS. 3A-3D illustrates cross-sections of a dual-sided HTS conductive tape according to embodiments of the present invention.

FIG. 3A illustrates yet another embodiment of the present invention. The embodiment is somewhat similar to that shown in FIG. 2, but essentially forms a double-sided structure, including first and second buffer layers 12a and 12b, respectively overlying first and second surfaces 11a and 11b of the substrate 10. Further, first and second superconductor layers 14a and 14b are provided, along with first and second capping layers 16a and 16b. This particular structure provides an advantage of further current-carrying capability by utilizing both sides of the substrate for coating of the superconductor layers 14a and 14b.

Figure 3B:
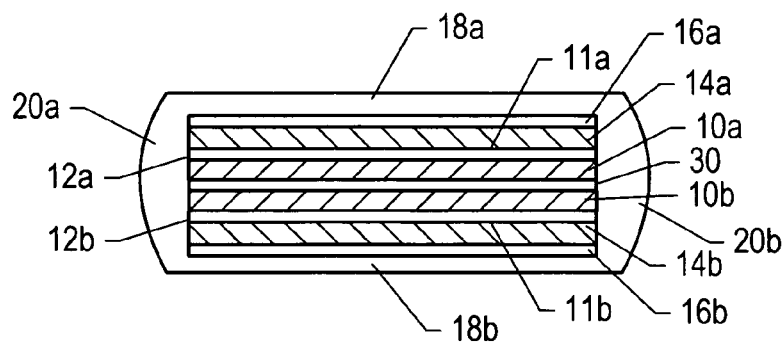

FIG. 3B is similar to FIG. 3A, but incorporates a dual-substrate structure in which substrates 10a and 10b are bonded to each other such that the respective overlying first and second superconductor layers 14a and 14b are outwardly facing. The substrates 10a and 10b are bonded to each other by bonding layer 30. Bonding layer 30 may take on any one of several suitable forms, such as a solder, which may include indium, tin, indium/tin, lead/tin, indium/led/tin and alloy combinations thereof.

Figure 3C:
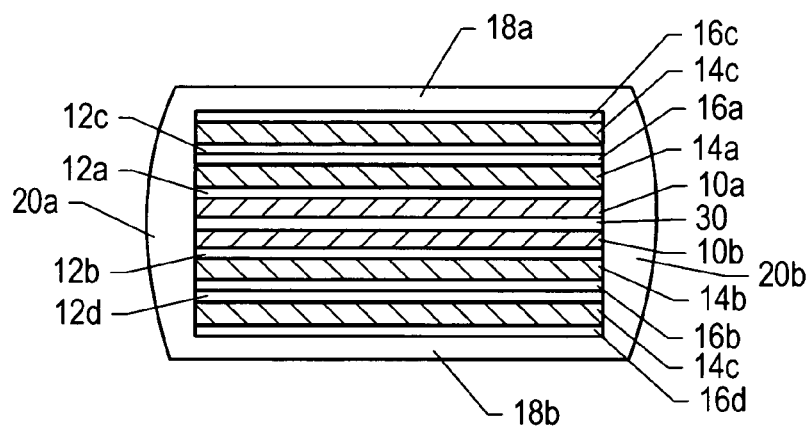

FIG. 3C is similar to FIG. 3B, but represents a more complex structure having two pairs of superconducting layers. In more detail, FIG. 3B incorporates a dual-substrate structure in which substrates 10a and 10b are bonded to each other such that the respective overlying first and second superconductor layers 14a and 14b are outwardly facing. The substrates 10a and 10b are bonded to each other by bonding layer 30. Bonding layer 30 may take on any one of several suitable forms, such as a solder, which may include indium, tin, indium/tin, lead/tin, indium/led/tin and alloy combinations thereof. Beyond the structure shown in FIG. 3B, the FIG. 3C structure includes third and fourth buffer layers 12c and 12d overlying the first and second capping layers, respectively. Further, third and fourth superconductor layers 14c and 14d are provided, followed by third and fourth capping layers 16c and 16d.

In yet another embodiment, the subcomponent layers: substrate, buffer, superconductor may be first stabilized, including surround stabilized according to the structure shown in FIG. 1, and the pre-stabilized structure may be bonded to a second pre-stabilized structure in a back-to-back structure, maintaining the open structure architecture of FIGS. 3A-3C. This structure is shown in FIG. Such a structure is generally analogous to that shown FIG. 3A, but incorporates two surround stabilizer layers. The structure includes a first substrate 10a, a first buffer layer 12a, a first superconductor layer 14a, a first capping layer 16a, and a first stabilizer structure including first stabilizer layer 18a, second stabilizer structure 18b and bridges 20a and 20b. A 'mirror' structure is also provided, bonded to the first substructure through a bonding layer 30. The mirror structure includes a second substrate 10b, a second buffer layer 12b, a second superconductor layer 14b, a second capping layer 16b, and a first stabilizer structure including third stabilizer layer 18c, fourth stabilizer structure 18c and bridges 20c and 20d.

Figure 3D:
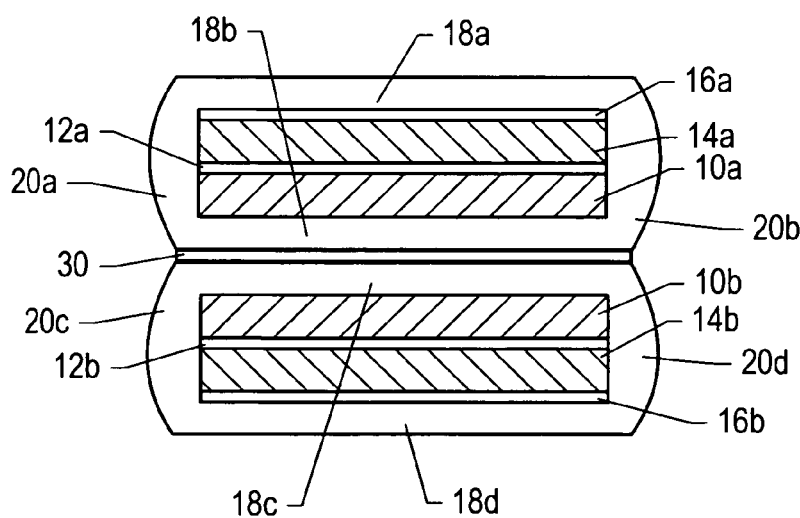

The structures shown in FIGS. 3A, 3B, 3C and 3D have an 'open' structure, in which the substrates are internal to the structure and the superconductor layers are outward facing, and the structure is free of substrates overlying the outermost superconductor layers. Specifically, the illustrated structures have a plurality of superconductor layers including outermost superconductor layers (those layers closest to the outermost major surfaces of the structure), and the structure is free of substrates overlying those outermost superconductor layers. That is, the structure is free of substrates between the outermost superconductor layers and the stabilizer layers. Turning specifically to the figures, the first and second superconductor layers 14a and 14b of FIGS. 3A, 3B and 3D are those outermost superconductor layers. The open structure is in direct contrast to various prior art structures that utilize a closed structure, in which substrates are outwardly facing, sandwiching therebetween the outermost superconductor layers.

Prior art closed structures, such as that shown in US 2005/0173679 have been in favor due to ease of fabrication and to aid in management of stresses within the structure, such as those encountered during winding of conductors. However, it has been discovered that the open structures, having outwardly positioned superconductor layers, particularly including outermost superconductor layers that are free of overlying substrate layers, perform in a far superior manner. Surprisingly, the open structure has been found to reduce contact resistance at superconducting joints by a full order of magnitude over closed structures, in the context of joined superconductors having overlapping ends. This is particularly true of the embodiment shown in FIGS. 3A and 3B, having a single pair of outwardly facing (and outermost) superconductor layers.

Figure 4:
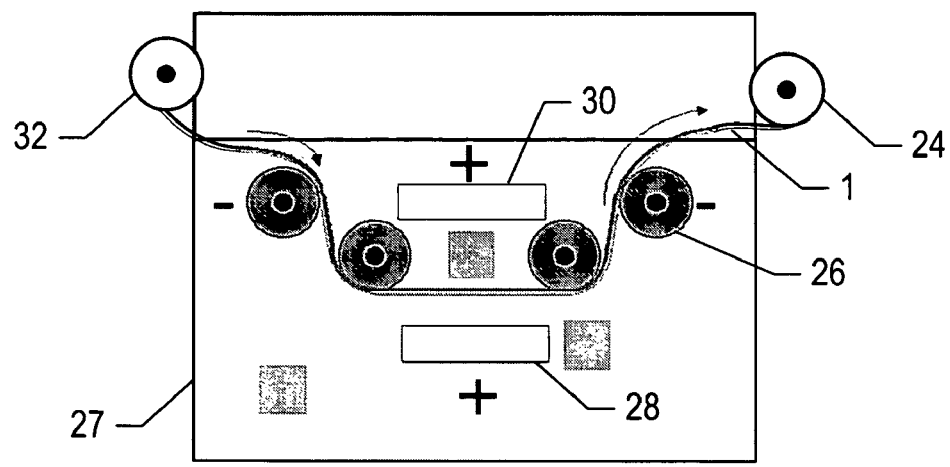
FIG. 4 illustrates an electroplating process according to an embodiment of the present invention.

FIG. 4 schematically illustrates an electroplating process according to an embodiment of the present invention. Typically, electroplating is carried out in a reel-to-reel process by feeding a superconductive tape through an electroplating solution 27 by feeding the tape from feed reel 32 and taking up the tape at take-up reel 34. The tape is fed through a plurality of rollers 26. The rollers may be negatively charged so as to impart a negative charge along the capping layer(s) and/or the substrate for electrodeposition of the metal ions provided in solution. The embodiment shown in FIG. 4 shows two anodes 28 and 30 for double-sided deposition, although a single anode 28 may be disposed for single-sided electroplating. As discussed above, the electroplating solution 27 generally contains metal ions of the desired species for electrodeposition. In the particular case of copper, the solution may be a copper sulfate solution containing copper sulfate and sulfuric acid, for example. The anodes 28, 30 provide the desired feedstock metal for electrodeposition, and may be simply formed of high-purity copper plates. It is noted that while the rollers 26 may be electrically biased so as to bias the superconductive tape, biasing may take place outside of the solution bath, to curtail unwanted deposition of metal on the rollers themselves.

A particular example was created utilizing the electroplating technique described above. In particular, samples were subjected to DC magnetron sputtering of silver to form 3 micron-thick capping layers. Those samples were placed in a copper-sulfate solution and biased such that the capping layers formed a cathode, the anode being a copper plate. Electroplating was carried out to form a copper layer having a nominal thickness of about 40 microns. Testing of the samples is described hereinbelow.

Figure 5:
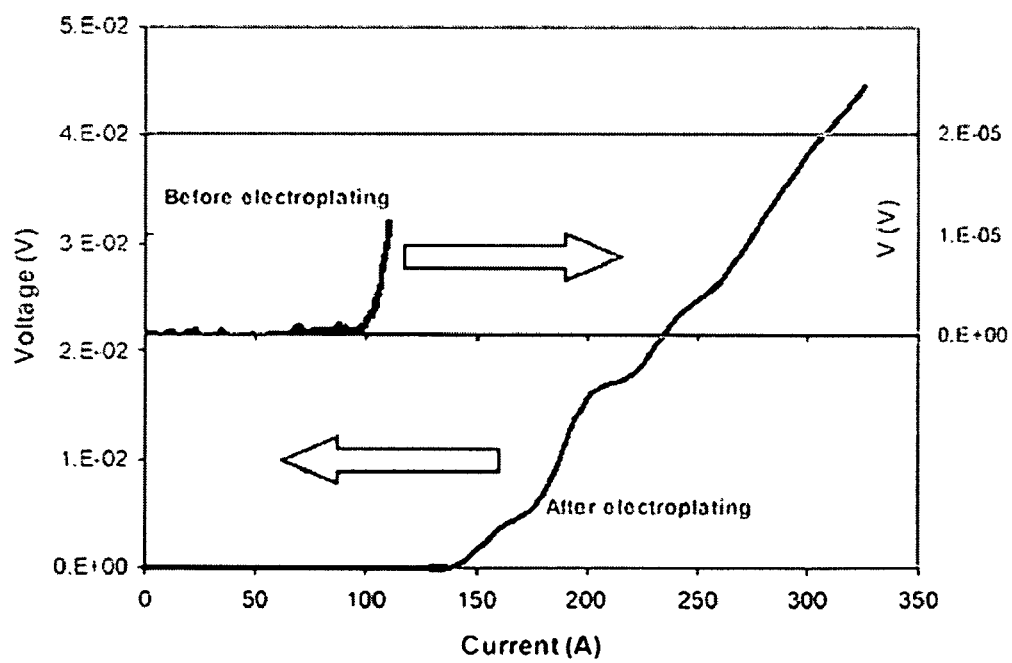
FIG. 5 illustrates the results of a current overloading test.

Namely, a sample that is 1 cm wide, 4 cm long and with 1.7 micron thick YBCO HTS layer having a critical current $I_c$ of about 111 A was subjected to a current load of 326 A. The sample was overloaded and voltage data was gathered as illustrated in FIG. 5. The voltage recorded was 44.4 mV at 326 A, which corresponds to heat dissipation of 3.6 W/cm$^2$— lower than the critical heat flux density in LN$_2$ cooling condition 5-20 W/cm$^2$. This means that this coated conductor with 50 micron stabilizer may carry a current higher than 326 A in LN$_2$ without experiencing burning out. Without the stabilizer, the estimated power dissipation is higher than 62.5 KW/cm$^2$ at 326 A. The foregoing indicates that the electroplated stabilizer layer acted as a robust shunt layer to protect the superconducting film from burning out during the overloading event.

Figure 6:
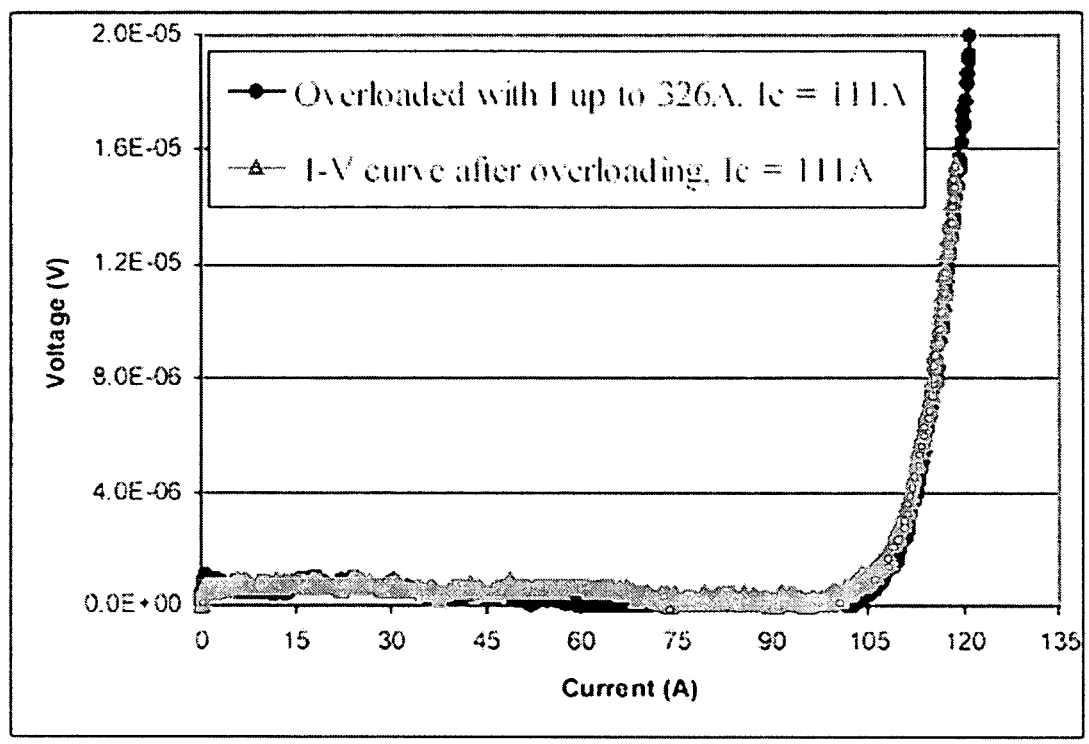
FIG. 6 illustrates the results of testing conducted to evaluate the effect of overloading on the critical current of the HTS tape.

Subsequently, the sample was then subjected to a second load, following the overloading event. As illustrated in FIG. 6, the curves show the same $I_c$ of about 111 A before and after overloading. The foregoing indicates that the HTS tape retained its critical current even after the overloading.

In order to provide adequate current-carrying capability in the stabilizer layer, typically the stabilizer layer has a thickness within a range of about 1 to about 1,000 microns, most typically within a range of about 10 to about 400 microns, such as about 10 to about 200 microns. Particular embodiments had a nominal thickness at about 40 microns and about 50 microns.

Figure 7:
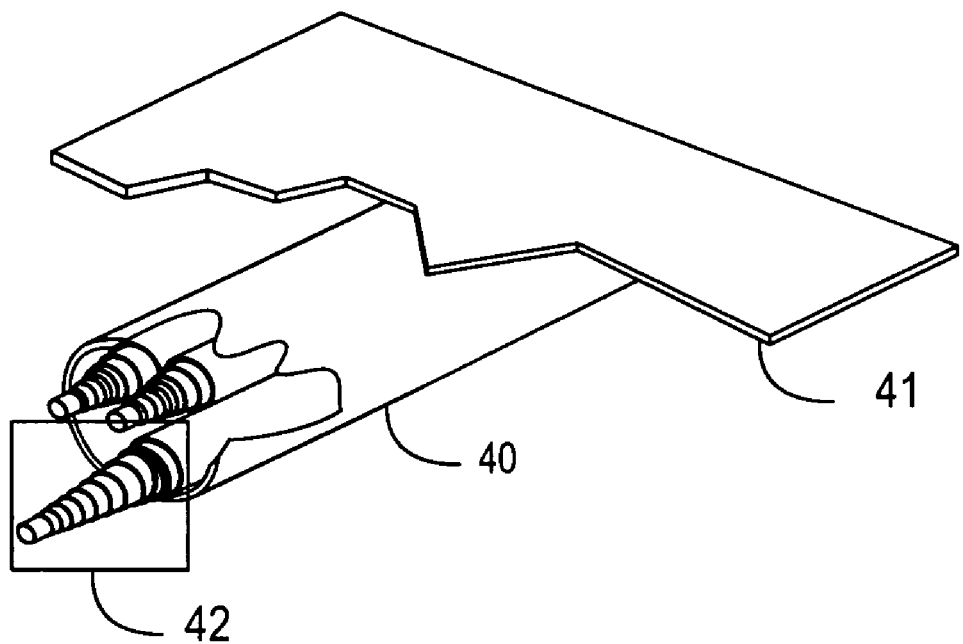
FIGS. 7 and 8 illustrate power cables incorporating superconductive tapes.
Figure 8:
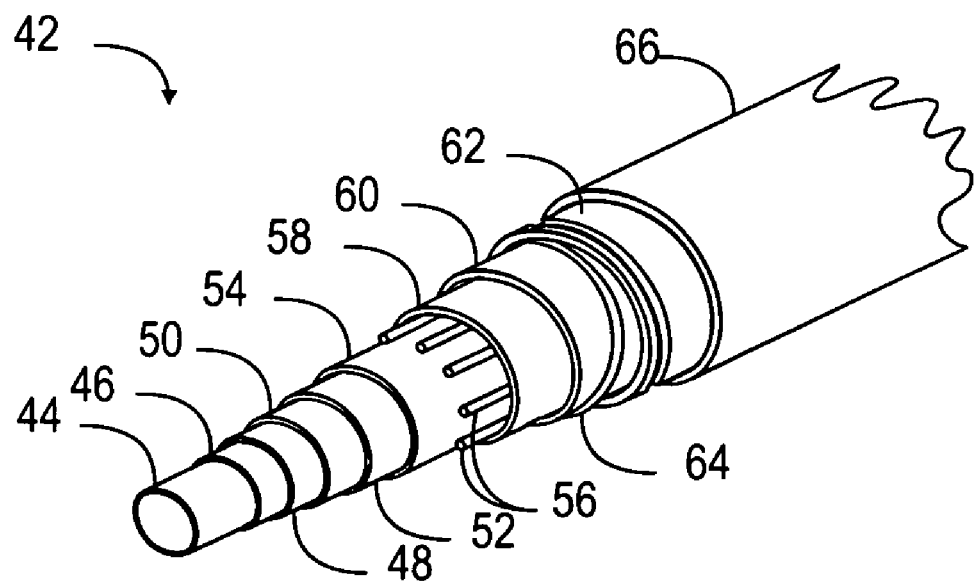

Moving away from the particular structure of the superconducting tape, FIGS. 7 and 8 illustrate implementation of a superconducting tape in a commercial power component, namely a power cable. FIG. 7 illustrates several power cables 42 extending through an underground conduit 40, which may be a plastic or steel conduit. FIG. 7 also illustrates the ground 41 for clarity. As is shown, several power cables may be run through the conduit 40.

Turning to FIG. 8, a particular structure of a power cable is illustrated. In order to provide cooling to maintain the superconductive power cable in a superconducting state, liquid nitrogen is fed through the power cable through LN2 duct 44. One or a plurality of HTS tapes 46 is/are provided so as to cover the duct 44. The tapes may be placed onto the duct 44 in a helical manner, spiraling the tape about the duct 44. Further components include a copper shield 48, a dielectric tape 50 for dielectric separation of the components, a second HTS tape 52, a copper shield 54 having a plurality of centering wires 56, a second, larger LN2 duct 58, thermal insulation 60, provided to aid in maintaining a cryogenic state, a corrugated steel pipe 62 for structural support, including skid wires 64, and an outer enclosure 66.

Figure 9:
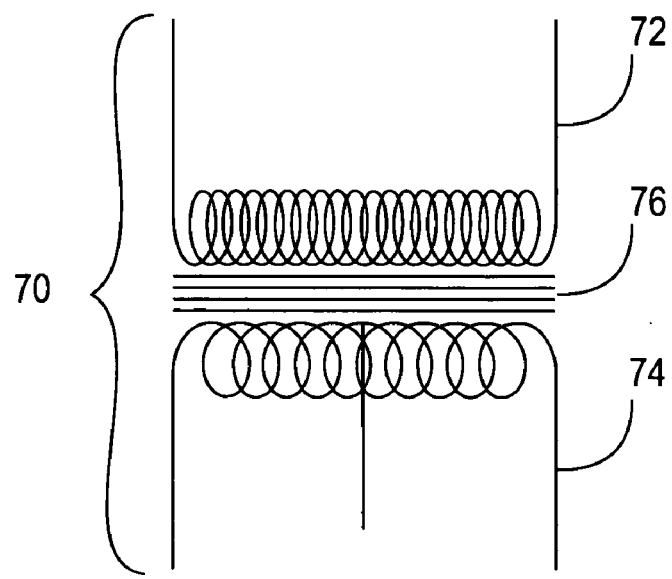
FIG. 9 illustrates a power-transformer according to an aspect of the present invention.
Figure 10:
FIG. 10 illustrates a power generator according to an aspect of the present invention
Figure 10:
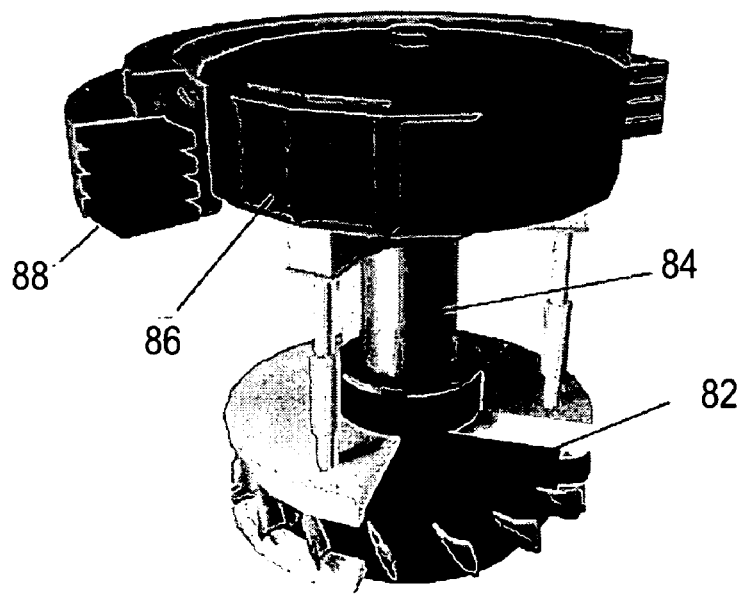

FIG. 9 illustrates schematically a power transformer having a central core 76 around which a primary winding 72 and a secondary winding 74 are provided. It is noted that FIG. 9 is schematic in nature, and the actual geometric configuration of the transformer may vary as is well understood in the art. However, the transformer includes the basic primary and secondary windings. In this regard, in the embodiment shown in FIG. 9, the primary winding has a higher number of coils than the secondary winding 74, representing a step-down transformer that reduces voltage of an incoming power signal. In reverse, provision of a fewer number of coils in the primary winding relative to the secondary winding provides a voltage step-up. In this regard, typically step-up transformers are utilized in power transmission substations to increase voltage to high voltages to reduce power losses over long distances, while step-down transformers are integrated into distribution substations for later stage distribution of power to end users. At least one of and preferably both the primary and secondary windings comprise superconductive tapes in accordance with the foregoing description Turning to FIG. 10, the basic structure of a generator is provided. The generator includes a turbine 82 connected to a shaft 84 for rotatably driving a rotor 86. Rotor 86 includes high-intensity electromagnets, which are formed of rotor coils that form the desired electromagnetic field for power generation. The turbine 82, and hence the shaft 84 and the rotor 86 are rotated by action of a flowing fluid such as water in the case of a hydroelectric power generator, or steam in the case of nuclear, diesel, or coal-burning power generators. The generation of the electromagnetic field generates power in the stator 88, which comprises at least one conductive winding. According to a particular feature of the embodiment, at least one of the rotor coils and the stator winding comprises a superconductive tape in accordance with embodiments described above. Typically, at least the rotor coils include a superconductive tape, which is effective to reduce hysteresis losses.

Figure 11:
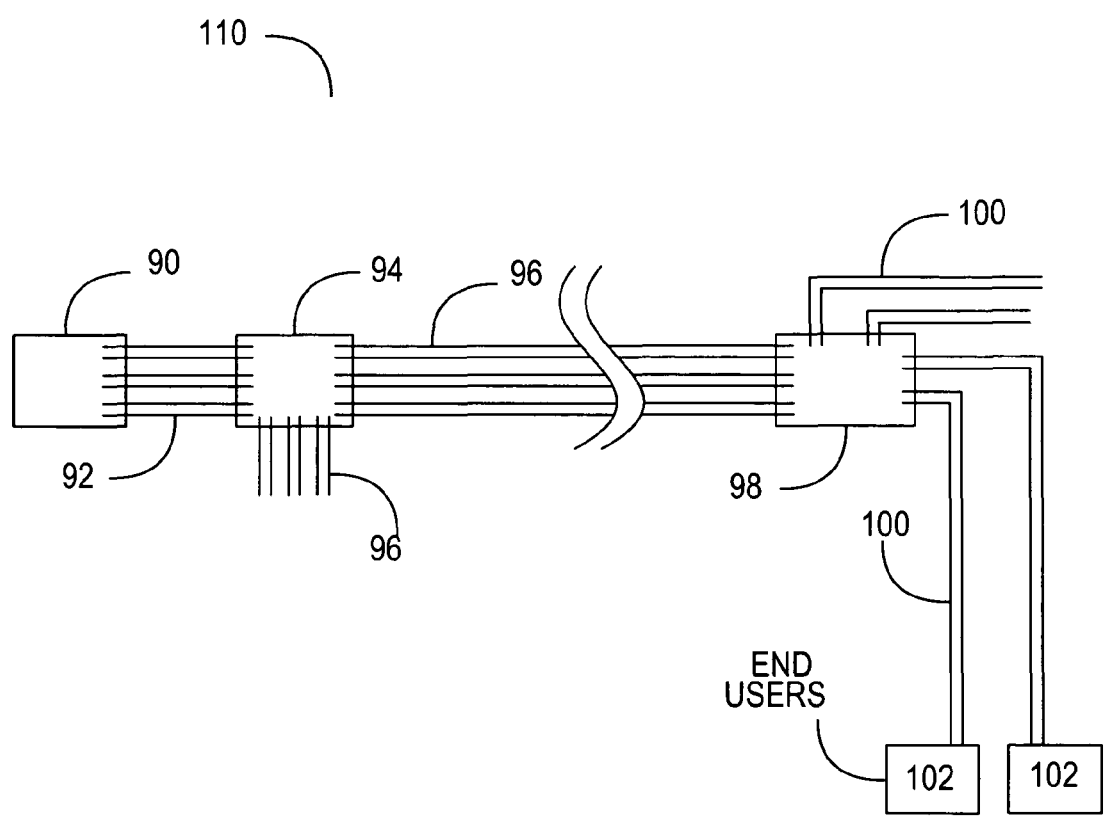
FIG. 11 illustrates a power grid according to another aspect of the present invention.

Turning to FIG. 11, a basic schematic of a power grid is provided. Fundamentally, the power grid 110 includes a power plant 90 typically housing a plurality of power generators. The power plant 90 is electrically connected and typically co-located with a transmission substation 94. The transmission substation contains generally a bank of step-up power transformers, which are utilized to step-up voltage of the generated power. Typically, power is generated at a voltage level on the order of thousands of volts, and the transmission substation functions to step-up voltages are on the order of 100,000 to 1,000,000 volts in order to reduce line losses. Typical transmission distances are on the order of 50 to 1,000 miles, and power is carried along those distances by power transmission cables 96. The power transmission cables 96 are routed to a plurality of power substations 98 (only one shown in FIG. 10). The power substations contain generally a bank of step-down power transformers, to reduce the transmission level voltage from the relatively high values to distribution voltages, typically less than about 10,000 volts. A plurality of further power substations may also be located in a grid-like fashion, provided in localized areas for localized power distribution to end users. However, for simplicity, only a single power substation is shown, noting that downstream power substations may be provided in series. The distribution level power is then transmitted along power distribution cables 100 to end users 102, which include commercial end users as well as residential end users. It is also noted that individual transformers may be locally provided for individual or groups of end users. According to a particular feature, at least one of the generators provided in the power plant 90, the transformers and the transmission substation, the power transmission cable, the transformers provided in the power substation, and the power distribution cables contain superconductive tapes in accordance with the present description.

While particular aspects of the present invention have been described herein with particularity, it is well understood that those of ordinary skill in the art may make modifications hereto yet still be within the scope of the present claims.

What is claimed is:

1. A superconducting article, comprising:
   first and second substrates bonded to each other and free of superconductor layers therebetween;
   first and second buffer layers overlying the first and second substrates respectively, such that the first and second substrates are positioned so as to be interposed between the first and second buffer layers;
   first and second superconductor layers overlying the first and second buffer layers, respectively, the first buffer layer between the first substrate and the first superconductor layer and the second buffer layer between the second substrate and the second superconductor layer; and
   first and second stabilizer layers respectively overlying the first and second superconductor layers, the first and second stabilizer layers adapted to conduct current and prevent burnout of the first and second superconductor layers when the first and second superconductor layers are in a non-superconductive state, wherein the first and second stabilizer layers are electrically connected together by side bridges extending along side surfaces of the article wherein the first and second side bridges form a convex contour along at least a portion of the side surfaces of the superconducting article.

2. The superconducting article of claim 1, wherein the first and second stabilizer layers consist essentially of a non-noble metal.

3. The superconducting article of claim 2, wherein the non-noble metal comprises a material from the group consisting of copper, aluminum, and alloys thereof.

4. The superconducting article of claim 3, wherein the non-noble metal comprises copper.

5. The superconducting article of claim 1, wherein the buffer layers comprise a biaxially crystal textured film having generally aligned crystals both in-plane and out-of-plane of the film.

6. The superconducting article of claim 1, wherein the first and second substrates are directly bonded to each other.

7. The superconducting article of claim 1, wherein the first and second substrates are indirectly bonded to each other such that at least one stabilizer layer is interposed between the first and second substrates.

8. The superconducting article of claim 1, wherein the side bridges comprise a material having a melting point at least 180° C.

9. The superconducting article of claim 8, wherein the side bridges comprise a high melting point solder, having a melting point at least 180° C.

10. The superconducting article of claim 1, wherein the side bridges and first and second stabilizer layers entirely surround the substrate, first and second buffer layer, and first and second superconductive layers.

11. The superconducting article of claim 10, wherein the side bridges and the first and second stabilizer layers form a continuous layer comprised of the same material, encapsulating the substrate, first and second buffer layer, and first and second superconductive layers.

12. A superconducting article, comprising:
    first and second substrates bonded to each other and free of a superconductor layer therebetween;
    first and second buffer layers overlying the first and second substrates respectively, such that the first and second substrates are positioned so as to be interposed between the first and second buffer layers;
    a plurality of superconductor layers including first and second outermost superconductor layers overlying the first and second buffer layers, respectively, the first buffer layer between the first substrate and the first outermost superconductor layer and the second buffer layer between the second substrate and the second outermost superconductor layer; and
    first and second stabilizer layers respectively overlying the first and second outermost superconductor layers, wherein the superconducting article is free of any substrates between the first and second outermost superconductor layers and respective first and second stabilizer layers, wherein the first and second stabilizer layers are electrically connected together by side bridges extending along side surfaces of the article wherein the first and second side bridges form a convex contour along at least a portion of the side surfaces of the superconducting article.

13. The superconducting article of claim 12, wherein the plurality of superconductor layers includes only said first and second outermost superconductor layers.

14. The superconducting article of claim 12, wherein the first and second stabilizer layers are adapted to conduct current and prevent burnout of the plurality of superconductor layers when the plurality of superconductor layers are in a non-superconductive state.

15. The superconducting article of claim 1, wherein the superconducting article is free of an intermediate bonding layer having a melting point less than 300° between the first stabilizer layer and the first superconducting layer and between the second stabilizer layer and the second superconducting layer.

16. The superconducting article of claim 1, wherein the first and second substrates each include a nickel-based metal alloy.

17. The superconducting article of claim 1, wherein the first and second stabilizer layers each include aluminum, silver, gold, or copper.

* * * * *